(12) United States Patent
Dürbaum

(10) Patent No.: US 7,330,046 B2
(45) Date of Patent: Feb. 12, 2008

(54) CIRCUITS AND METHODS FOR FAILURE PREDICTION OF PARALLEL MOSFETS

(75) Inventor: Thomas Dürbaum, Baiersdorf (DE)

(73) Assignee: NXP B.V., Eindhoven (NL)

( * ) Notice: Subject to any disclaimer, the term of this patent is extended or adjusted under 35 U.S.C. 154(b) by 2 days.

(21) Appl. No.: 10/570,211

(22) PCT Filed: Aug. 20, 2004

(86) PCT No.: PCT/IB2004/051511

§ 371 (c)(1),
(2), (4) Date: Feb. 28, 2006

(87) PCT Pub. No.: WO2005/022747

PCT Pub. Date: Mar. 10, 2005

(65) Prior Publication Data

US 2007/0007519 A1    Jan. 11, 2007

(30) Foreign Application Priority Data

Sep. 3, 2003  (EP) .................................. 03102689

(51) Int. Cl.
*G01R 31/26* (2006.01)

(52) U.S. Cl. ........................ 324/769; 324/770

(58) Field of Classification Search ................ 324/769; 340/644, 635, 653, 645; 323/282; 363/56.01, 363/56.11; 361/56–57, 100; 327/434

See application file for complete search history.

(56) References Cited

U.S. PATENT DOCUMENTS

| | | | |
|---|---|---|---|
| 4,532,443 A * | 7/1985 | Glennon | 327/404 |
| 5,319,929 A * | 6/1994 | Cornelison et al. | 60/274 |
| 6,222,709 B1 * | 4/2001 | Baba | 361/18 |
| 6,456,104 B1 * | 9/2002 | Guarin et al. | 324/769 |
| 6,751,080 B2 * | 6/2004 | Yamaji | 361/93.8 |
| 7,161,776 B2 * | 1/2007 | Henninger | 361/18 |
| 2006/0221527 A1 * | 10/2006 | Jacobson | 361/100 |

FOREIGN PATENT DOCUMENTS

EP    1150428 A2 * 10/2001
EP    1152531 A2 * 11/2001

* cited by examiner

*Primary Examiner*—Vinh P. Nguyen
(74) *Attorney, Agent, or Firm*—Peter Zawilski

(57) ABSTRACT

Power conversion circuits often consist of several MOSFETs operating in parallel. Due to thermal cycling and mechanical operations. MOSFETs or the respective electric connections of the MOSFETs may fail. For certain implementations, a diagnosis circuit for a plurality of parallel MOSFETs predicts or determines a possible failure on the basis of at least one of temperatures of the MOSFETs or gate voltages of the MOSFETs. In some applications, the MOSFETs are monitored to facilitate early determination of failures of the MOSFETs.

20 Claims, 2 Drawing Sheets

CIRCUITS AND METHODS FOR FAILURE PREDICTION OF PARALLEL MOSFETS

The present invention relates to an electronic circuit and a method of operating a first MOSFET and a second MOSFET.

Power conversion circuits consisting of several MOSFETs in parallel are made in order to enlarge a power range of such circuits, in comparison to single packaged devices. Such circuits find a more and more widespread application in the automotive and industrial field. These power circuits obtain high current ratings, due to the paralleling of the MOSFETs.

To avoid a complete failure of such a power circuit in case one or more of the paralleled MOSFETs fail or one or more electrical connections such as solder connections break, it is known to provide redundant MOSFETs to replace MOSFETs with failures.

It is an object of the present invention to predict or determine a possible failure of a MOSFET.

According to an exemplary embodiment of the present invention, the above object may be solved with an electronic circuit comprising a first MOSFET and a second MOSFET, which are arranged in parallel. Furthermore, there is provided a diagnosis circuit for predicting a possible failure of one of the first and second MOSFETs. According to an aspect of this exemplary embodiment of the present invention, the diagnosis circuit predicts the possible failure of one of the first and second MOSFETs on the basis of at least one of a temperature of at least one of the first and second MOSFETs and a gate voltage of at least one of the first and second MOSFETs.

Advantageously, this exemplary embodiment of the present invention may allow to predict a possible failure of one of the first and second MOSFETs of, for example, a power module, before the actual error or failure occurs. Due to this, a change of the MOSFETs or of the module, for which a failure is predicted may be performed before the failure actually occurs.

Furthermore, according to this exemplary embodiment of the present invention, the provision of redundant MOSFETs may be omitted such that more simple, cheaper and smaller electronic circuits may be provided.

According to another exemplary embodiment of the present invention, a first temperature sensor may be arranged at the first MOSFET for measuring the first temperature of the MOSFET. Then, the diagnosis circuit is adapted such that it predicts the possible failure of the second MOSFET on the basis of a rise of the first temperature at the first MOSFET.

According to another exemplary embodiment of the present invention, there is provided a second temperature sensor, which is arranged for measuring the overall temperature of the first and second MOSFETs. For this, according to an aspect of this exemplary embodiment of the present invention, the second temperature sensor may be arranged on a package of the module including the first and second MOSFETs. Also, in the case of discrete MOSFETs mounted to a common heat sink, the second temperature sensor may be provided on the common heat sink. The diagnosis circuit according to this exemplary embodiment of the present invention, is adapted to predict a possible failure of one of the first and second MOSFETs on the basis of a temperature rise of the overall temperature of the first and second MOSFETs. Furthermore, an ambient temperature sensor may be provided for measuring an ambient temperature or reference temperature.

Advantageously, according to this exemplary embodiment of the present invention, the provision of only one temperature sensor may be sufficient for predicting a possible failure of one of the MOSFETs.

According to another exemplary embodiment of the present invention, there is provided a third temperature sensor, arranged at the second MOSFET for measuring the temperature of this second MOSFET. The diagnosis circuit according to this exemplary embodiment of the present invention, is adapted such that it predicts a possible failure of the second MOSFET on the basis of a drop of the third temperature at the second MOSFET.

According to another exemplary embodiment of the present invention, there is provided a gate voltage monitoring unit for monitoring a gate voltage of the first MOSFET. The diagnosis circuit according to this exemplary embodiment of the present invention, is adapted to predict the possible failure of the second MOSFET on the basis of a decrease of the gate voltage of the first MOSFET. This embodiment may preferably be implemented in combination with a gate voltage control according to which the gate voltages are adjusted to equalize the currents through the MOSFETs and/or the temperatures of the MOSFETs.

This exemplary embodiment of the present invention may be advantageous in an electronic circuit or power module comprising gate voltage controlling means to control a resistance RDSon of the MOSFETs. Such RDSon control may be implemented on the basis of a current flowing through the MOSFETs during operation or on the basis of the temperature of one of more of the MOSFETs. Preferably, such RDSon control is implemented to equalize the current sharing among the MOSFETs. In such electronic circuits, by decreasing the gate voltage of a first MOSFET to increase the RDSon of this first MOSFET, the RDSons of the first MOSFET and a second MOSFET are adjusted to each other such that both MOSFETs have the same RDSon, i.e. carry the same current load. In other words, the "better" MOSFET is artificially deteriorated by increasing its RDSon to adjust it to the RDSon of the second MOSFET. An increased RDSon may be taken as an indicator for a possible failure of this MOSFET.

Thus, according to this exemplary embodiment of the present invention, when the gate voltage of the first MOSFET is decreased to increase its RDSon, it may be predicted that the second MOSFET has an increased RDSon, which may be taken as an indicator that this second RDSon may soon have a failure.

According to another exemplary embodiment of the present invention, the diagnosis circuit sends a warning message when it predicts a possible failure of one of the first and second MOSFETs. Advantageously, in case such an electronic circuit is used, for example, in automotive applications, a warning message may be output to a diagnosis system or service indicator. On the basis of this message, a service or "change MOSFET" message may be output to a user or operator.

According to another exemplary embodiment of the present invention, the electronic circuit is a power module, in particular for the use in automotive applications.

According to another exemplary embodiment of the present invention, a method is provided of operating a first MOSFET and a second MOSFET. According to this method, a possible failure of one of the first and second MOSFETs is predicted on the basis of at least one of a temperature of at least one of the first and second MOSFETs and the gate voltage of at least one of the first and second MOSFETs.

Advantageously, this may allow for an early prediction of a failure in the operation of the first and second MOSFETs.

It may be seen as the gist of an exemplary embodiment of the present invention that a possible failure of one of the first and second MOSFETs is predicted on the basis of at least one of a temperature of at least one of the first and second MOSFETs and a gate voltage of at least one of the first and second MOSFETs. According to the present invention, it may be possible to predict a possible failure of a MOSFET or to determine an actual failure of one of the MOSFETs. An upcoming or existent failure of a MOSFET may cause a strong change in the device stress applied to the remaining devices in the electronic circuit, which may lead to different temperatures occurring in the electronic circuit. For example, such (possible) failure may be detected either as an overall temperature increase of the electronic circuit, or a temperature rise at the remaining individual MOSFETs or as a temperature drop for the MOSFETs having the failure, i.e. the destroyed one. Also, in combination with a MOSFET current equalization control, a (possible) failure of one MOSFET may be detected on the basis of a gate voltage decrease of another MOSFET.

These and other aspects of the present invention will become apparent from and elucidated with reference to the embodiments described hereinafter.

Exemplary embodiments of the present invention will be described in the following, with reference to the following drawings.

Figure 1:
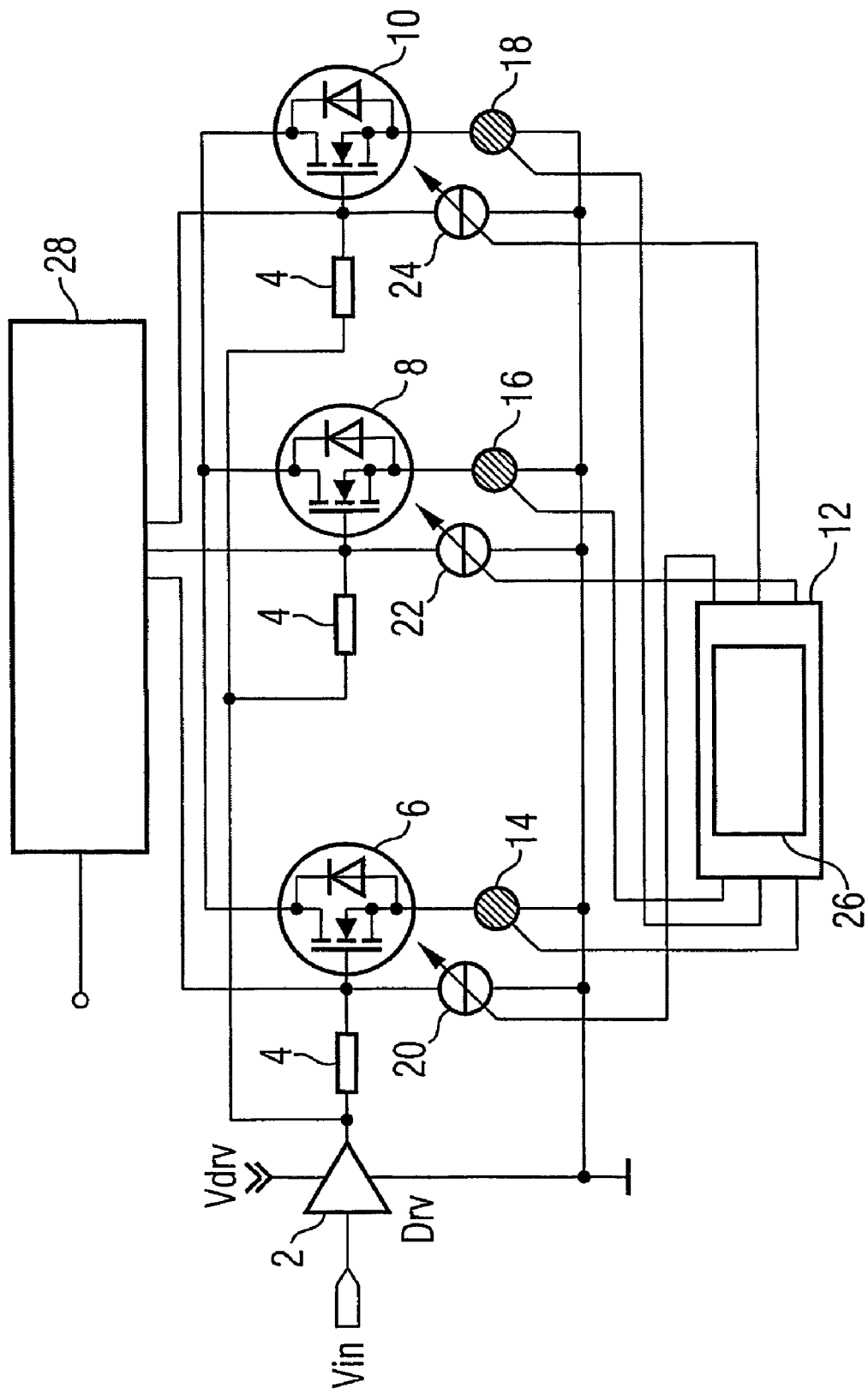
FIG. 1 shows a simplified schematic circuit diagram of a first exemplary embodiment of an electronic circuit according to the present invention.

In the following description made with reference to FIGS. 1 and 2, the same reference numerals are used to designate the same or corresponding elements.

FIG. 1 shows a simplified schematic circuit diagram of a first exemplary embodiment of the electronic circuit according to the present invention. According to an aspect of this exemplary embodiment of the present invention, the electronic circuit is a power module, comprising a plurality of MOSFETs (power MOSFETs), arranged in parallel. However, as apparent to the skilled person, the present invention may also be applied to discrete MOSFETs mounted to a common heat sink as they are suitable in particular for automotive applications.

Reference numeral 2 in FIG. 1 designates a driver, the output of which is connected to resistors 4. The driver 2 and the resistors 4 are arranged for driving a plurality of MOSFETs, here a first, second and third MOSFETs 6, 8 and 10, which are respectively arranged in parallel to each other. Furthermore, there are provided first, second and third current measurement units, 14, 16 and 18, which are respectively arranged in association with the first, second and third MOSFETs 6, 8 and 10 for respectively measuring the currents flowing through the first, second and third MOSFETs 6, 8 and 10 during operation. The first, second and third current measurement units 14, 16 and 18 are connected to a MOSFET resistance controller 12 for controlling on-resistances RDSon of the first, second and third MOSFETs 6, 8 and 10 on the basis of the current measurements of the first, second and third current measurement units 14, 16 and 18.

Reference numerals 20, 22 and 24 designate controlled current sources, which are arranged for controlling gate voltages of the first, second and third MOSFETs 6, 8 and 10.

Instead of the provision of the current sources 20, 22 and 24, resistors may be provided. Together with these resistors, reliable resistors controlled by the resistance control 12 may be respectively provided in series to the resistors 4.

The MOSFET resistance controller is adapted to control the RDSons of the first, second and third MOSFETs 6, 8 and 10 individually. For this, the gate voltage control circuit 26 is adapted to control, adjust or equalize at least one of the gate voltages of the first, second and third MOSFETs 6, 8 and 10 on the basis of at least one (preferably all) of the currents determined by the current measurement units 14, 16 and 18. The gate voltages of the first, second and third MOSFETs 6, 8 and 10 are controlled by means of the controlled current sources 20, 22 and 24, controlled by means of the MOSFET resistance control 12 including the gate voltage control circuit 26. Preferably, the control is such that the RDSons are adjusted to each other, i.e. the currents through the MOSFETs 6, 8 and 10 are equalized.

According to variants of this exemplary embodiment of the present invention, instead of the provision of the current measurement units 14, 16 and 18, temperature sensors may be provided for measuring temperatures of at least one (preferably all) of the first, second and third MOSFETs 6, 8 and 10. Then, the gate voltage circuit 26 may be adapted to individually control, adjust or equalize at least one of the gate voltages of the first, second and third MOSFETs 6, 8 and 10 on the basis of at least one (preferably all) of the temperatures of the first, second and third MOSFETs 6, 8 and 10. In particular, the control may be such that the RDSons of the MOSFETs 6, 8 and 10 are adjusted to each other, i.e. equalized. The control may also be such that the temperatures of the MOSFETs 6, 8, 10 or the currents through the MOSFETs 6, 8 and 10 are adjusted to each other, i.e. equalized.

Reference numeral 28 designates a diagnosis circuit for predicting a possible failure of one of the first, second and third MOSFETs 6, 8 and 10. According to an aspect of this exemplary embodiment of the present invention, the diagnosis circuit predicts or determines the possible or actual failure of at least one of the first, second and third MOSFETs 6, 8 and 10 on the basis of a gate voltage of at least one (preferably all) of the first, second and third MOSFETs 6, 8 and 10. The gate voltage of the first, second and third MOSFETs 28 may be determined by means of the diagnosis circuit 28. However, according to an aspect of this exemplary embodiment of the present invention, the gate voltage of at least one of the first, second and third MOSFETs 6, 8 and 10 may also be directly taken from the driving signals of the controlled current sources 20, 22 and 24, which are proportional to the gate voltages. The diagnosis circuit 28 is adapted such that it predicts the possible failure of one MOSFET of the first, second and third MOSFETs 6, 8 and 10 on the basis of an decrease of the gate voltage of the other MOSFET of the first, second and third MOSFETs 6, 8 and 10. Thus, for example, if a decrease of the gate voltage of the first MOSFET 6 is determined, the diagnosis circuit 28 predicts or determines the failure of the second MOSFET 8.

In case the diagnosis circuit 28 determines a failure of one of the MOSFETs 6, 8 and 10 or predicts a possible failure of one of the MOSFETs 6, 8 and 10, which may be caused, for example, by a degrading quality of soldering joints of the devices, the diagnosis circuit 28 sends a message to, for example, a diagnosis system or service system of a car. In such cases, a service message may be issued to an operator, such that a repair or an exchange of the respective power module may be carried out.

According to an aspect of this exemplary embodiment, all gate voltages of the MOSFETs 6, 8 and 10 are determined. Then, a possible failure of a MOSFET is detected when the gate voltages of one or more of the other MOSFETs are decreased. Thus, for example, a failure may be determined when a voltage difference exceeds a pre-set threshold. Also, a failure may be determined at a MOSFET when it is held at a much higher gate voltage in comparison to the other MOSFETs.

Figure 2:
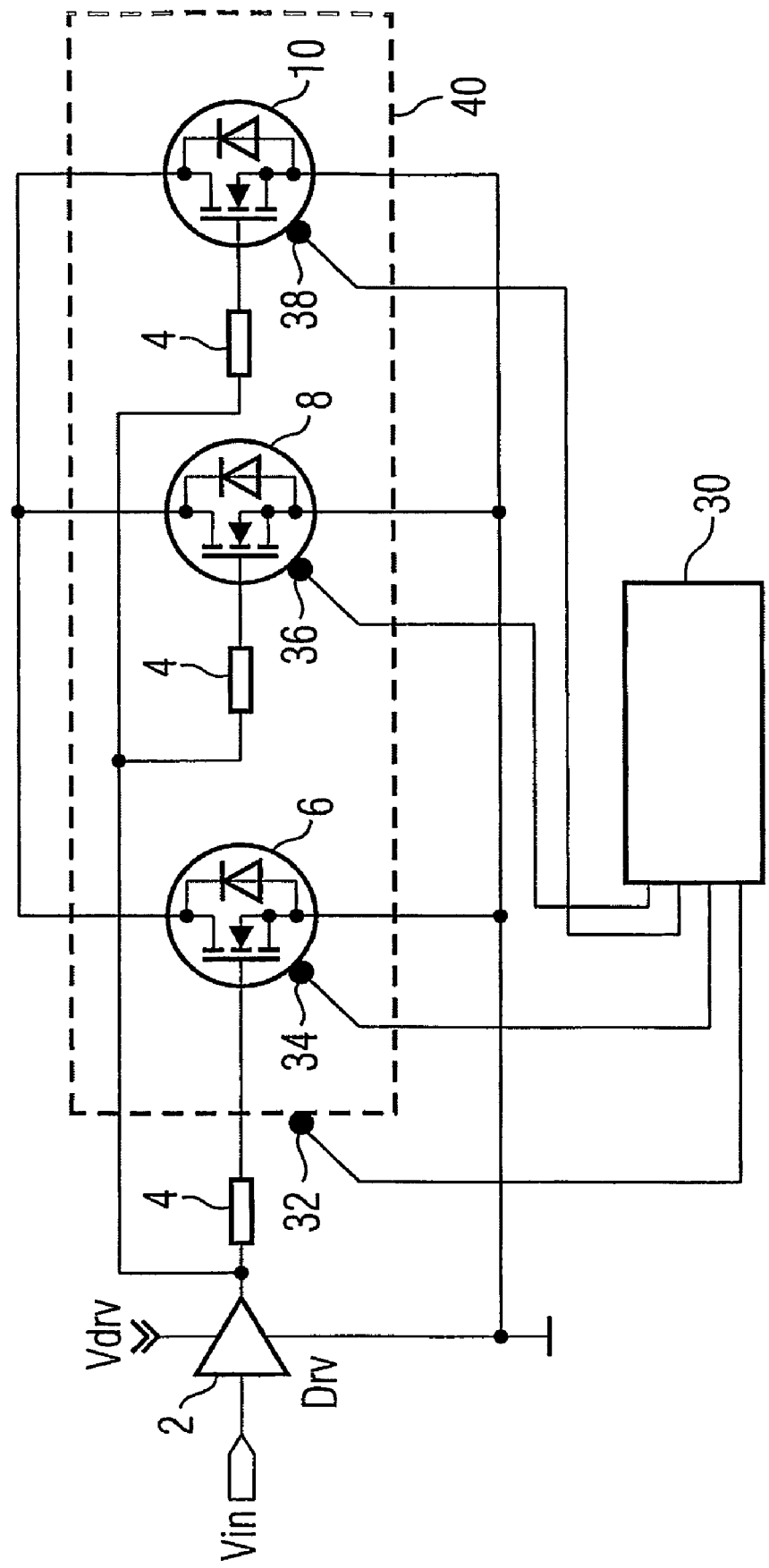
FIG. 2 shows a simplified schematic circuit diagram of a second exemplary embodiment of an electronic circuit according to the present invention.

FIG. 2 shows a simplified schematic circuit diagram of a second exemplary embodiment of the electronic circuit according to the present invention. The electronic circuit depicted in FIG. 2 comprises a plurality of MOSFETs which are arranged parallel to each other. Preferably, the electronic circuit depicted in FIG. 2 is a power module, for example, for automotive applications. However, as apparent to the skilled person, the present invention may also be applied to discrete MOSFETs.

Reference numeral 30 in FIG. 2 depicts a diagnosis circuit connected to temperature sensors 32, 34, 36 and 38. As may be taken from FIG. 2, the temperature sensors 34, 36 and 38 are respectively arranged at the first, second and third MOSFETs 6, 8 and 10 such that they respectively measure the individual temperature of each of the first, second and third MOSFETs 6, 8 and 10.

Reference numeral 40 designates a broken line, which indicates that the first, second and third MOSFETs 6, 8 and 10 include the temperature sensors 34, 36, and 38 may integrally be included into one package or mounted to a common heat sink. This package 40 (or the heat sink) may be provided with another temperature sensor 32, which measures the overall temperature of the three MOSFETs 6, 8 and 10. In other words, the temperature sensor 32 is arranged such that it measures the overall temperature of the MOSFETs 6, 8 and 10, which are arranged in parallel and which form the power module. According to an aspect of the present invention, the provision of the sensor 32 without the sensors 34, 36 and 38 may be sufficient.

The diagnosis circuit 30 according to one aspect of this exemplary embodiment of the present invention, is adapted such that it predicts or determines the (possible) failure of one MOSFET of the first, second and third MOSFETs 6, 8 and 10 on the basis of a rise of the temperature of another MOSFET of the first, second and third MOSFETs 6, 8 and 10. Thus, for example, a failure of the second MOSFET 8 may be determined on the basis of a temperature rise of both of the first and third MOSFETs 6 and 10. A failure of the second MOSFET 8 or the third MOSFET 10 may be determined on the basis of a temperature rise of the first MOSFET 6.

This is based on the fact that in case one MOSFET fails or decreases such that its RDSon increases, it will no longer (or to a lesser extent) help to carry the current. Due to this, the current distribution will shift, such that a higher load, i.e. a higher current is applied to the remaining MOSFETs. Due to the increase of the device stress of the remaining (not failing) MOSFETs, the temperatures of these devices will increase. Furthermore, an increase of the overall losses is also caused. This temperature rise is detected and serves as an indicator of a failure or possible failure of one or more of the MOSFETs.

Furthermore, the diagnosis circuit 30 may be adapted such that it predicts or determines the (possible) failure of one of the first, second and third MOSFETs 6, 8 and 10 on the basis of the overall temperature determined by means of the temperature sensor 32. Thus, in case one of the first, second and third MOSFETs 6, 8 and 10 deteriorates or fails, as described above, the temperature of the remaining components increases. This increase is detected by means of the temperature sensor 32 and serves as an indicator that one of the MOSFETs 6, 8 and 10 deteriorates or fails. In such case, no sensors 34, 36 and 38 are necessary. In other words, in case one of the MOSFETs deteriorates, the overall power loss of the circuit increases. This increasing power loss causes an increase of the temperature which, according to an aspect of the present invention, may be detected and used for predicting a possible failure.

Furthermore, the diagnosis circuit 30 according to this exemplary embodiment of the present invention, may be arranged such that it determines a failure of one of the first, second or third MOSFETs 6, 8 or 10 on the basis of a temperature drop of the temperature at this particular MOSFET of the first, second and third MOSFETs 6, 8 and 10. This is due to the fact that in case one particular MOSFET deteriorates or fails, the current load on this particular MOSFET decreases, due to its increase in RDSon, such that less heat is generated in this particular MOSFET. This temperature drop is detected and serves as an indicator that this MOSFET deteriorates or fails. The diagnosis circuit 30 is adapted such that in case it determines or predicts a failure of one of the first, second and third MOSFETs 6, 8 and 10, it sends a warning message to, for example, a diagnosis system or service manager of, for example, a car. Such a warning message may prompt a service message to a driver.

Furthermore, according to an aspect of this exemplary embodiment of the present invention, the diagnosis circuit may be extended in such a way that, if it determines a deterioration or failure of one of the first segmented MOSFETs 6, 8 and 10, it shuts this particular MOSFET off. However, even the deteriorated MOSFET may still be operated to contribute to the overall power. In case the present invention is combined with a gate voltage control according to which the gate voltages are adjusted to equalize the currents through the MOSFETs and/or the temperatures of the MOSFETs, the current through this deteriorated MOSFET or the temperature of this MOSFET should then no longer be used for the control of the gate voltages.

The circuit depicted in FIG. 2 may also be combined with the resistance control 12 described with reference to FIG. 1.

The present invention may, in particular be advantageous in case of a N+1 redundancy system, where, if one of the MOSFETs fails, the system could still work, but a warning message could be sent to, for example, the diagnosis system, prompting, for example, a change of this particular power module or of this particular MOSFET.

Advantageously, the above described exemplary embodiments of the present invention may allow for a continuous online monitoring of electronic circuits such as high current modules. In particular in automotive electronics, such monitoring is becoming more and more important due to the increasing demands with respect to the reliability of the components.

The invention claimed is:

1. Electronic circuit, comprising: a first MOSFET and a second MOSFET, wherein the first and second MOSFETs are arranged in parallel; and a diagnosis circuit for predicting a possible failure of one of the first and second MOSFETs; wherein the diagnosis circuit predicts the possible failure of one of the first and second MOSFETs on the basis of at least one of a temperature of at least one of the first and second MOSFETs and a gate voltage of at least one of the first and second MOSFETs.

2. The electronic circuit of claim 1, further comprising: a temperature sensor arranged at the first MOSFET for measuring a temperature of the first MOSFET; wherein the diagnosis circuit predicts the possible failure of the second MOSFET on the basis of a rise of the temperature at the first MOSFET which is determined by means of the temperature sensor.

3. The electronic circuit of claim 1, further comprising: a temperature sensor arranged for measuring an overall temperature of the first and second MOSFETs; wherein the diagnosis circuit predicts the possible failure of one of the first and second MOSFETs on the basis of a temperature rise of the overall temperature.

4. The electronic circuit claim 1, further comprising: a temperature sensor arranged at the second MOSFET for measuring a temperature of the second MOSFET; wherein the diagnosis circuit predicts the possible failure of the second MOSFET on the basis of a drop of the temperature at the second MOSFET which is determined by means of the temperature sensor.

5. The electronic circuit of claim 1, further comprising: a gate voltage monitoring unit for monitoring the gate voltage of the first MOSFET; wherein the diagnosis circuit predicts the possible failure of the second MOSFET on the basis of a decrease of the gate voltage of the first MOSFET.

6. The electronic circuit of claim 1, wherein the diagnosis circuit sends a warning message when it predicts the possible failure of one of the first and second MOSFETs.

7. The electronic circuit of claim 1, wherein the electronic circuit is a power conversion circuit in particular for use in automotive applications.

8. Method of operating a first MOSFET and a second MOSFET, wherein the first and second MOSFETs are arranged in parallel, the method comprising the steps of determining at least one of a temperature of at least one of the first and second MOSFETs and a gate-source voltage of at least one of the first and second MOSFETs; predicting a possible failure of one of the first and second MOSFETs on the basis of the at least one of the temperature of at least one of thu first and second MOSFETs and the gate voltage of at least one of the first and second MOSFETs; and providing an output indicative of the possible failure of one of the first and second MOSFETs.

9. The method of claim 8, further comprising the steps of: determining a temperature of the first MOSFET; predicting the possible failure of the second MOSFET on the basis of a rise of the temperature at the first MOSFET.

10. The method of claim 8, further comprising the steps of: determining an overall temperature of the first and second MOSFETs; predicting the possible failure of one of the first and second MOSFETs on the basis of a temperature rise of the overall temperature.

11. The method of claim 8, further comprising the steps of: determining a temperature of the second MOSFET; predicting the possible failure of the second MOSFET on the basis of a drop of the temperature at the second MOSFET.

12. The method of claim 8, further comprising the steps of: monitoring the gate voltage of the first MOSFET; predicting the possible failure of the second MOSFET on the basis of a decrease of the gate voltage of the first MOSFET.

13. The method of claim 8, wherein the step of providing an output includes sending a warning message when the possible failure of one of the first arid second MOSFETs is predicted.

14. An electronic circuit, comprising:
first and second MOSFETs arranged in parallel;
a temperature sensor to sense a temperature of at least one of the first and second MOSFETs; and
a diagnosis circuit to predict a possible failure of one of the first and second MOSFETs in response to at least one of
the temperature of at least one of the first and second MOSFETs as sensed by the temperature sensor, and
a gate voltage of at least one of the first and second MOSFETs.

15. The electronic circuit of claim 14, wherein
the temperature sensor is arranged at the first MOSFET to sense a temperature of the first MOSFET, and
the diagnosis circuit predicts the possible failure of the second MOSFET in response to the temperature sensor sensing a rise of the temperature at the first MOSFET.

16. The electronic circuit of claim 14, wherein
the temperature sensor is arranged to sense an overall temperature of the first and second MOSFETs, and
the diagnosis circuit predicts the possible failure of one of the first and second MOSFETs in response to the temperature sensor sensing a rise of the overall temperature of the first and second MOSFETs.

17. The electronic circuit of claim 14, wherein
the temperature sensor is arranged at the second MOSFET to sense a temperature of the second MOSFET, and
the diagnosis circuit predicts the possible failure of the second MOSFET in response to the temperature sensor sensing a drop of the temperature at the second MOSFET.

18. The electronic circuit of claim 14, further including:
a gate voltage monitoring unit to detect the gate voltage of the first MOSFET,
wherein the diagnosis circuit predicts the possible failure of the second MOSFET in response to the gate voltage monitoring unit detecting a decrease of the gate voltage of the first MOSFET.

19. The electronic circuit of claim 14, wherein the diagnosis circuit sends a warning message in response to predicting the possible failure of one of the first and second MOSFETs.

20. The electronic circuit of claim 14, wherein the electronic circuit is an automotive power conversion circuit.

* * * * *